United States Patent
Hong

(10) Patent No.: US 12,019,515 B2
(45) Date of Patent: Jun. 25, 2024

(54) ELECTRONIC DEVICE WITH ERASURE CODING ACCELERATION FOR DISTRIBUTED FILE SYSTEMS AND OPERATING METHOD THEREOF

(71) Applicant: SAMSUNG ELECTRONICS CO., LTD., Suwon-si (KR)

(72) Inventor: Jae-Ki Hong, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 21 days.

(21) Appl. No.: 17/881,872

(22) Filed: Aug. 5, 2022

(65) Prior Publication Data

US 2023/0208439 A1     Jun. 29, 2023

(30) Foreign Application Priority Data

Dec. 29, 2021   (KR) ...................... 10-2021-0191495

(51) Int. Cl.
| | | |
|---|---|---|
| *G06F 11/10* | (2006.01) | |
| *G06F 16/182* | (2019.01) | |
| *H03M 13/00* | (2006.01) | |
| *H03M 13/11* | (2006.01) | |
| *H04L 67/1097* | (2022.01) | |

(52) U.S. Cl.
CPC ........ *G06F 11/1076* (2013.01); *G06F 16/182* (2019.01); *H03M 13/11* (2013.01); *H03M 13/6513* (2013.01); *H04L 67/1097* (2013.01)

(58) Field of Classification Search
CPC .............. G06F 11/1076; G06F 16/182; G06F 16/1827; G06F 11/1096; G06F 8/44; G06F 11/1088; G06F 16/1834; H03M 13/11; H03M 13/6513; H04L 67/1097
See application file for complete search history.

(56) References Cited

U.S. PATENT DOCUMENTS 9,747,162 B2    8/2017  Ben Dayan et al.
11,150,986 B2*  10/2021  Li ....................... H03M 13/154
(Continued)

OTHER PUBLICATIONS

Koh, Sungjoon, et al. "Exploring fault-tolerant erasure codes for scalable all-flash array clusters." *IEEE Transactions on Parallel and Distributed Systems* vol. 30. Issue 6 (2018). pp. 1-18.
(Continued)

*Primary Examiner* — Cynthia Britt
(74) *Attorney, Agent, or Firm* — NSIP Law

(57) ABSTRACT

Disclosed are a storage node and method. The storage node includes a storage device, and a smart NIC, where the smart NIC is configured to receive a write request including original data to be stored in the DFS, and responsive to the receiving, generate parity data by performing erasure coding on the original data, and store the parity data and the original data directly from the smart NIC to the storage device, and receive, from a client device or another client device, a read request for data stored in the DFS, where the smart NIC is further configured to, responsive to receiving the read request, fetch a portion of the original data and the parity data directly from the storage device, and recover another portion of the original data by applying forward error correction (FEC) decoding to the fetched portion of the original data using the fetched parity data.

20 Claims, 8 Drawing Sheets

(56) References Cited

U.S. PATENT DOCUMENTS

| | | | |
|---|---|---|---|
| 11,169,881 B2* | 11/2021 | Li | H03M 13/6502 |
| 11,349,501 B2* | 5/2022 | Danilov | G06F 16/182 |
| 2017/0046227 A1* | 2/2017 | Fan | H03M 13/1515 |
| 2019/0347165 A1* | 11/2019 | Kim | G06F 16/184 |
| 2021/0117360 A1 | 4/2021 | Kutch et al. | |
| 2021/0135685 A1 | 5/2021 | Kumar et al. | |
| 2021/0157676 A1* | 5/2021 | Nakagawa | G06F 3/0689 |
| 2021/0211467 A1 | 7/2021 | Naeimi et al. | |
| 2021/0232331 A1 | 7/2021 | Kannan et al. | |
| 2021/0273660 A1 | 9/2021 | Danilov et al. | |
| 2021/0303400 A1 | 9/2021 | Li | |
| 2022/0206910 A1* | 6/2022 | Vaideeswaran | G06F 11/2007 |

OTHER PUBLICATIONS

Pertin, Dimitri, et al. "Distributed File System Based on Erasure Coding For I/O Intensive Applications." 4th International Conference on Cloud Computing and Service Science (Closer). vol. 1. SciTePress, 2014, (6 pages in English).

Shi, Haiyang, et al. "TriEC: Tripartite Graph Based Erasure Coding NIC Offload." Proceedings of the International Conference for High Performance Computing, Networking, Storage and Analysis. 2019, (34 pages in English).

Schweitzer, Scott, "Why is a SmartNIC Better than a Regular NIC?" ElectronicDesign, https://www.electronicdesign.com/markets/automation/article21134459/xilinx-why-is-a-smartnic-better-than-a-regular-nic, Jun. 30, 2020, (6 pages in English).

Extended European search report dated Jun. 2, 2023, in counterpart European Patent Application No. 22194371.5 (15 pages in English).

* cited by examiner

| | 01 | 00 | 00 | 00 | | | | | | | A | B | C | D | |
|---|---|---|---|---|---|---|---|---|---|---|---|---|---|---|---|
| Unit matrix | 00 | 01 | 00 | 00 | | A | B | C | D | | E | F | G | H | Original data |
| | 00 | 00 | 01 | 00 | × | E | F | G | H | = | I | J | K | L | |
| | 00 | 00 | 00 | 01 | | I | J | K | L | | M | N | O | P | |
| Parity matrix | 1b | 1c | 12 | 14 | | M | N | O | P | | 51 | 52 | 53 | 49 | Parity block |
| | 1c | 1b | 14 | 12 | | | | | | | 55 | 56 | 57 | 25 | |

Coding matrix 320　　　Original data 310　　　Encoded data 330

FIG. 3

ELECTRONIC DEVICE WITH ERASURE CODING ACCELERATION FOR DISTRIBUTED FILE SYSTEMS AND OPERATING METHOD THEREOF

CROSS-REFERENCE TO RELATED APPLICATIONS

This application claims the benefit under 35 USC § 119(a) of Korean Patent Application No. 10-2021-0191495, filed on Dec. 29, 2021, in the Korean Intellectual Property Office, the entire disclosure of which is incorporated herein by reference for all purposes.

BACKGROUND

1. Field

The following description relates to an electronic device with erasure coding acceleration for a distributed file system (DFS) and an operating method thereof.

2. Description of Related Art

Generally, a distributed file system (DFS) uses replication for assurance against data loss. For example, a storage system may use a redundant array of independent disks 1 (RAID-1) to mirror the same data, which may also increase capacity overhead of the storage system. RAID-5/6, for example, may require calculating and storing parity data and rebuilding the data through the parity data when a data loss occurs. Here, although storage capacity overhead may be reduced by various techniques, there have been limits on how much rebuilding performance can be improved.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a storage node for communicating via a network with other storage nodes to provide a distributed file system (DFS), the storage node including a storage device, and a smart network interface card (NIC) including a processing unit, where the smart NIC is configured to receive, from a client device, a write request including original data to be stored in the DFS, and responsive to receiving the write request, generate, by the processing unit, parity data by performing erasure coding on the original data, and store the parity data and the original data directly from the smart NIC to the storage device, and receive, from the client device or another client device, a read request for data stored in the DFS, where the smart NIC is further configured to, responsive to receiving the read request, fetch a portion of the original data and the parity data directly from the storage device, and recover, by the processing unit, another portion of the original data by applying forward error correction (FEC) decoding to the fetched portion of the original data using the fetched parity data.

The storage node may be further configured to transmit, by the smart NIC, the fetched portion of the original data and the recovered other portion of the original data via a network to the client device or the other client device.

The write request may be received from a network connected to the storage node.

The read request may be received from a network connected to the storage node.

The storage node may further include a memory, a host processor, wherein the storage node may be configured to cause the host processor to execute an operating system, and a bus interconnecting the host processor, the memory, the smart NIC, and the storage device, where the directly storing of the parity data and the original data may include sending the parity data and the original data directly from the NIC to the storage device via the bus.

The smart NIC and the storage device may be connected by a peripheral component interconnect express (PCIe) switch, and the original data and the parity data may be fetched directly from the storage device to the smart NIC via the PCIe switch.

The performing the erasure coding may be based on a coding matrix of erasure coding.

The smart NIC may be configured to determine that a loss of at least some of the original data has occurred and perform the FEC decoding based thereon.

The smart NIC may be configured to determine that there has been a loss of at least some of the original data and to fetch the parity data based thereon.

The storage device may include a second processing unit configured to perform FEC encoding or decoding on data of the DFS stored in, or to be stored in, the storage device.

The storage device may include a memory pool for supporting a compute express link (CXL).

In one general aspect, a method of operating a storage node including a smart NIC and a storage device includes receiving, by the smart NIC, DFS data from a client device, the smart NIC including a processing unit, the DFS data including data to be stored in a DFS, in response to receiving the DFS data, generating parity data by the processing unit performing erasure encoding on the received DFS data, and copying the DFS data and the parity data directly from the smart NIC to the storage device, wherein the DFS data is stored in the storage device as part of the DFS.

The method may further include receiving, by the smart NIC, a read request associated with the DFS data, in response to receiving the read request, copying a first portion of the DFS data directly from the storage device to the smart NIC, determining, by the processing unit, that a second portion of the DFS data may be missing, and based thereon using, by the processing unit, the parity data to recover the second portion of the DFS data, and transmitting, by the smart NIC, the first and second portions of the DFS data.

The storage node may further include a processor and memory configured to cooperate to execute an operating system, and wherein the memory and processor may not be used for the generating the parity data or for the recovering the second portion of the DFS data.

The smart NIC and the storage device may be connected by a peripheral component interconnect express (PCIe) switch, where the DFS data may be copied from the smart NIC to the storage device through the PCIe switch.

The erasure encoding of the DFS data may include an encoding operation based on an erasure coding matrix.

The method may further include receiving a write request from a first client device via a network, where the write request may include the DFS data.

The method may further include receiving the read request from the client device or a second client device via the network, and transmitting the first and second portions of the DFS data via the network to the client device or the second electronic device.

The storage node may be one storage node among a plurality of storage nodes that cooperate via a network to provide the DFS, and wherein the received DFS data may include a portion of data stored in one or more other storage nodes among the plurality of storage nodes.

The storage device may include a second processing unit configured to use the parity data to data recovery on the DFS data stored in the storage device.

In one general aspect, embodiments include a non-transitory computer-readable storage medium storing instructions that, when executed by a processor, configure the processor to perform any one, any combination, or all operations and/or methods described herein.

In one general aspect, a method performed by a storage node including a smart NIC and a storage device, includes receiving, by the smart NIC, DFS read requests and DFS write requests associated with a DFS, generating, by the smart NIC, DFS parity data for original DFS data in the DFS write requests, adding the original DFS data and the DFS parity data to the DFS by storing the original DFS data and the DFS parity data in the storage device, and, based on the DFS read requests, reading, by the smart NIC, at least some of the original DFS data and the DFS parity data, and based thereon, reconstructing, by the smart NIC, at least some portions of the original DFS data.

The generating the parity may include performing forward error correction coding on the original DFS data.

The forward error correction coding may include erasure coding.

In one general aspect, a device includes a network interface device for a DFS, wherein the network interface device comprises a processor configured to in response to receiving DFS data from a client device, generate recovery data by encoding the DFS data, store the DFS data and the recovery data directly from the network interface device to a storage device, the DFS data being stored in the storage device as part of the DFS, in response to receiving a request from the client device or another client device for the DFS data, fetch one or more portions of the DFS data and the recovery data directly from the storage device; and reconstruct another one or more portions of the DFS data using the recovery data, wherein the other one or more portions are not reconstructed in association with the request.

Other features and aspects will be apparent from the following detailed description, the drawings, and the claims.

BRIEF DESCRIPTION OF THE DRAWINGS

FIG. 3 shows an example of erasure coding, according to one or more embodiments.

Figure 1:
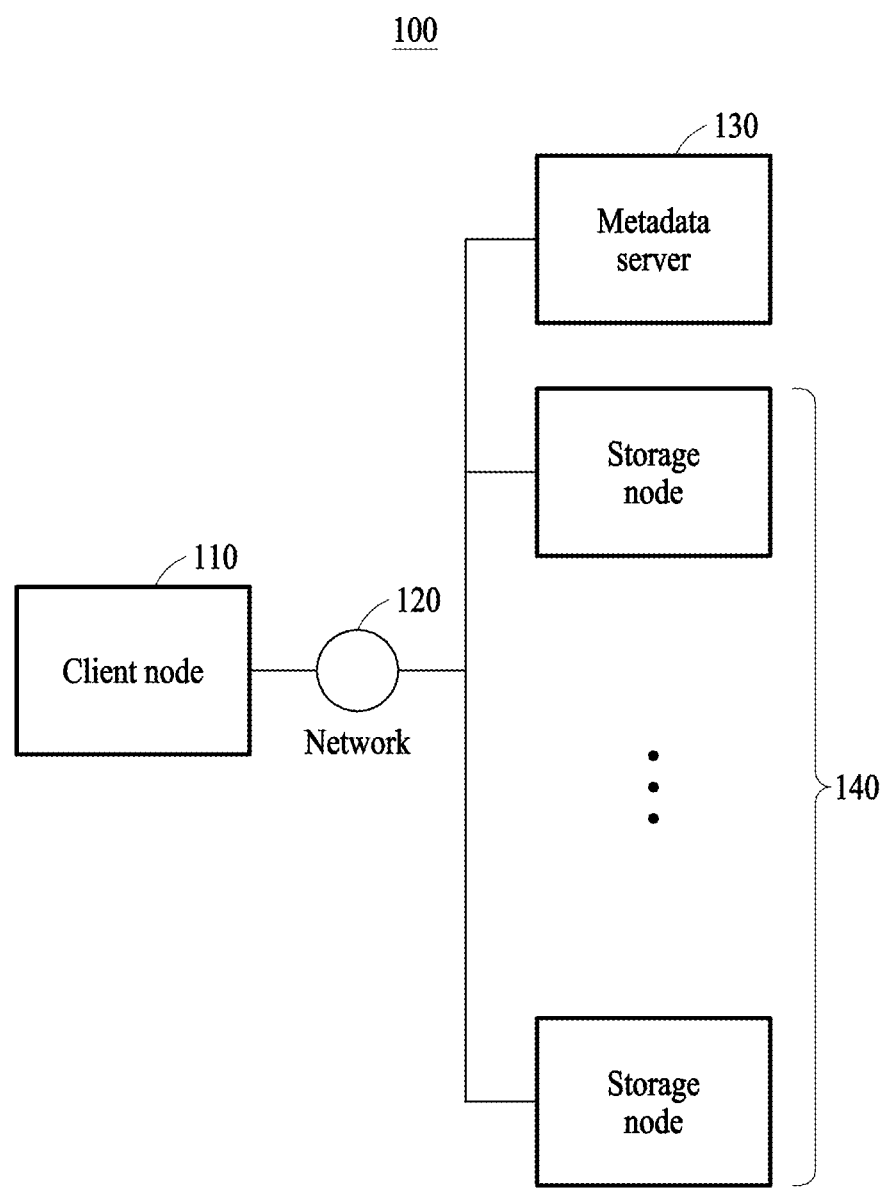
FIG. 1 illustrates an example of a distributed file system, according to one or more embodiments.

Throughout the drawings and the detailed description, unless otherwise described or provided, the same drawing reference numerals will be understood to refer to the same or like elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order.

Although terms of "first" or "second" are used to explain various components, the components are not limited to the terms. These terms should be used only to distinguish one component from another component. For example, a "first" component may be referred to as a "second" component, or similarly, and the "second" component may be referred to as the "first" component within the scope of the right according to the concept of the present disclosure.

It will be understood that when a component is referred to as being "connected to" another component, the component can be directly connected or coupled to the other component or intervening components may be present.

As used herein, the singular forms "a", "an", and "the" are intended to include the plural forms as well, unless the context clearly indicates otherwise. As used herein, the term "and/or" includes any one and any combination of any two or more of the associated listed items. As used herein, the terms "include," "comprise," and "have" specify the presence of stated features, numbers, operations, elements, components, and/or combinations thereof, but do not preclude the presence or addition of one or more other features, numbers, operations, elements, components, and/or combinations thereof.

Unless otherwise defined, all terms used herein, including technical or scientific terms, have the same meanings as those generally understood consistent with and after an understanding of the present disclosure. Terms, such as those defined in commonly used dictionaries, should be construed to have meanings matching with contextual meanings in the relevant art and the present disclosure, and are not to be construed as an ideal or excessively formal meaning unless otherwise defined herein. The use of the term "may" herein with respect to an example or embodiment, e.g., as to what an example or embodiment may include or implement, means that at least one example or embodiment exists where such a feature is included or implemented, while all examples are not limited thereto.

FIG. 1 illustrates an example of a DFS 100, according to one or more embodiments. Referring to FIG. 1, the DFS 100 may include a client node 110, a network 120, a metadata server 130, and a plurality of storage nodes 140. The DFS 100 may distribute and store data in the plurality of storage nodes 140, which are physically separated through the network 120 such that even when any one node fails, data may be recovered relatively easily compared to a single-node environment.

The client node 110 may be an electronic device that performs data processing, and may be embodied as, for example, various computing devices such as a laptop, a personal computer (PC), a desktop, a workstation, a server, etc. The client node 110 may access the metadata server 130 and the plurality of storage nodes 140 through the network 120 and may store data in one or more of the plurality of storage nodes 140 or read stored data therefrom.

The metadata server 130 may manage metadata associated with data stored in the plurality of storage nodes 140. Since data is distributed and stored in one or more of the plurality of storage nodes 140, information associated with a size and a storage location of each piece of divided data may be managed as metadata. The metadata server 130 may store and manage metadata for the data stored in one or more of the plurality of storage nodes 140.

For example, when the client node 110 is to store data in one or more of the plurality of storage nodes 140, the client node 110 may access the metadata server 130 via the network 120 to generate metadata of the data to be stored and may store the data in one or more of the plurality of storage nodes 140 based on the generated metadata. In addition, when the client node 110 is to read data distributed in one or more nodes among the plurality of storage nodes 140, the client node 110 may access the metadata server 130 via the network 120 to check the metadata for the data to be read, and may thus verify a storage location and size of the distributed data.

To be described in detail hereinafter, the metadata server 130 may be implemented as a node separate from the plurality of storage nodes 140. In an example, some portion of the plurality of storage nodes 140 may also serve as the metadata server 130.

The plurality of storage nodes 140 may store data or transmit stored data based on a request from the client node 110 via the network 120. Each of the plurality of storage nodes 140 may include a storage device and may store distributed data (e.g., DFS data or objects) thereon. A storage node's storage device may be a device for storing data, and may include, for example, one or more of a solid-state drive (SSD), a hard disk drive (HDD), or the like.

Erasure coding may be applied to the DFS 100. Erasure coding may be used for data recovery by encoding original data using a coding matrix known as an erasure code. Original data may be recovered through a decoding process when a portion of its encoded form is lost. To be described in detail hereinafter, erasure coding may set a data block and a parity block suitable for a user environment such that the reliability of data and capacity overhead may be adjusted. However, previously, an encoding operation and a decoding operation have been performed by a storage node's host processor based on erasure coding, which has increased overhead of the host processor.

In the examples described herein, each storage node 140 may include an interface device. Each interface device may include a processing unit that may perform an encoding operation and a decoding operation based on erasure coding. Therefore, each storage node 140 may directly transmit and receive encoded data through peer-to-peer (P2P) communication between its interface device and a storage device. Thus, it is possible to avoid an erasure coding overhead increase of the host processor and possibly accelerate the erasure coding by having the interface device's processing unit preform the erasure coding. Examples will be described in detail hereinafter.

Figure 2:
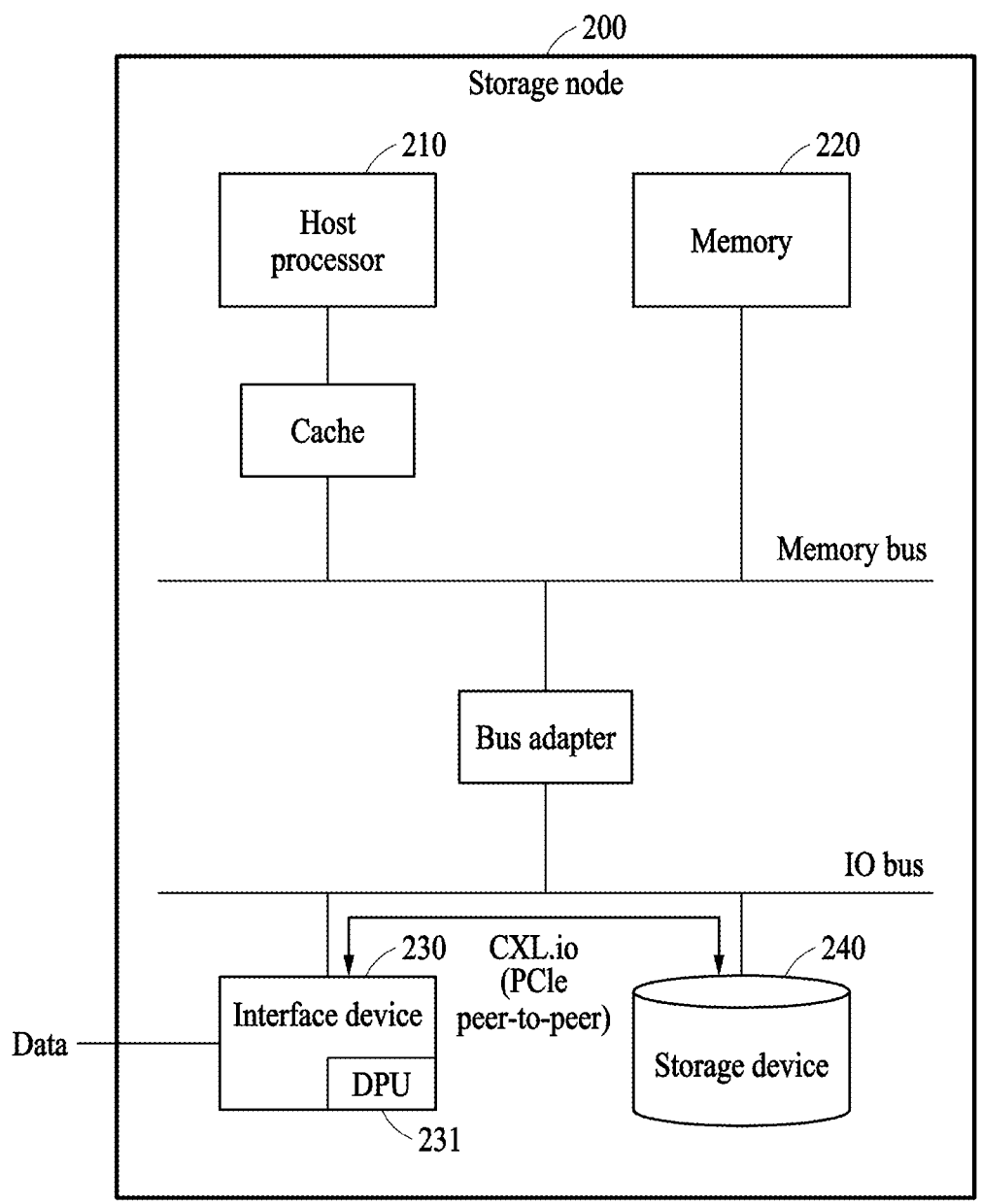
FIG. 2 shows an example of a storage node, according to one or more embodiments.

FIG. 2 shows an example of a storage node 200, according to one or more embodiments. Referring to FIG. 2, the storage node 200 may be an electronic device including a host processor 210, a memory 220, an interface device 230, and a storage device 240. The storage node 200 may be embodied as various computing devices such as, for example, a laptop, a PC, a desktop, a workstation, a virtual machine, or a server.

The host processor 210 may be a device that controls operations of components included in the storage node 200 by executing an operating system. The host processor 210 may include, for example, a central processing unit (CPU). The host processor 210 may control operations performed by the storage node 200.

The memory 220 may include computer-readable instructions. The host processor 210 may perform operations when instructions stored in the memory 220 are executed by the host processor 210. The memory 220 may be a volatile memory or a non-volatile memory. For example, the memory 220 may be dynamic random-access memory (DRAM).

The host processor 210 and the memory 220 may communicate with each other through a memory bus.

The interface device 230 may be a network interface card (NIC) that receives or transmits data from another electronic device (e.g., a client node, a metadata server, another storage node, etc.). The interface device 230 may be a smart NIC including a processing unit. The interface device 230 may perform an encoding operation or a decoding operation based on erasure coding using the processing unit. For example, the processing unit may include a data processing unit (DPU) 231 (i.e., processor or other processing circuitry). In some embodiments, the interface device 230 may be an FPGA-based (Field Programmable Gate Array) smart NIC.

FIG. 3 shows an example of erasure coding, according to one or more embodiments. Erasure coding may be employed by various DFSs, such as a Hadoop DFS (HDFS), Ceph, Swift, WekalO, and the like. The DFS 100 may be implemented as any of these example DFSs, or others like them. Erasure coding may involve generating a parity block and recovering data through the parity block when a data loss occurs and may adjust data reliability and capacity overhead based on a user environment by setting a size of a data block and the parity block (i.e., a coding rate).

Erasure coding may provide fault tolerance by dividing one file into n blocks and generating k parity blocks less than or equal to n. Consequently, a data capacity of n+k blocks may be needed to store the encoded file, and it may be possible to respond to a number of block failures up to the number of parity blocks (i.e., k). In the example illustrated in FIG. 3, n may be 4, and k may be 2.

FIG. 3 illustrates an example of an operation of encoding original data 310 received from another electronic device based on a coding matrix 320 for erasure coding. The original data 310 may represent data to be stored by a DFS, and the coding matrix 320 may be an erasure code used for encoding and may include a unit matrix and a parity matrix. The coding matrix 320 may be predetermined and may have been previously selected by the DPU 231 of the interface device 230 illustrated in FIG. 2. The DPU 231 may perform encoding through matrix multiplication between the coding matrix 320 and the original data 310, and may thus output encoded data 330. The encoded data 330 may include the original data 310 and a parity block. The parity block may be used for recovering data when a loss of the original data 310 occurs.

Figure 4:
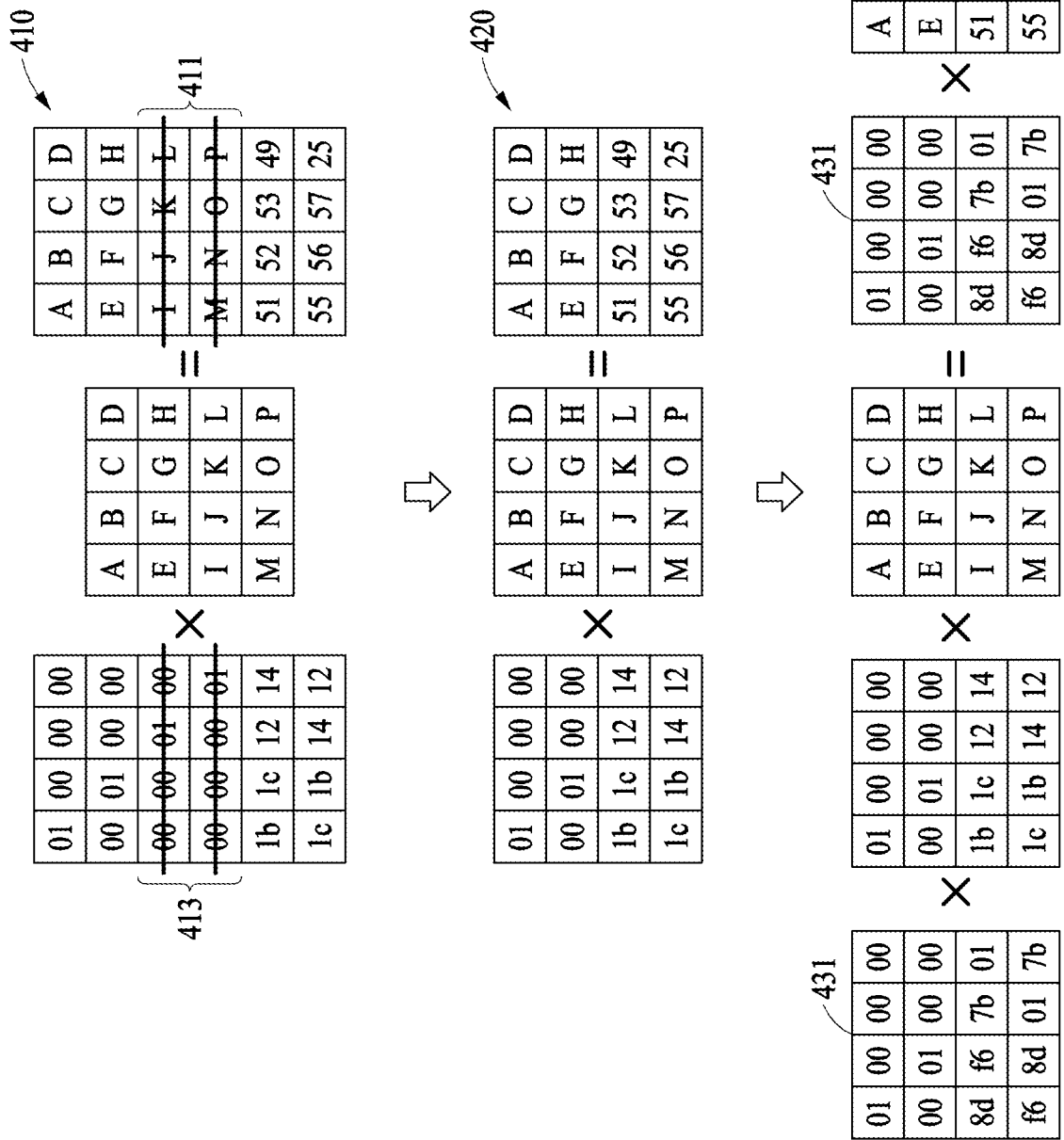
FIG. 4 shows an example of a forward error correction (FEC) decoding operation based on erasure coding, according to one or more embodiments.

FIG. 4 shows an example of an FEC decoding operation based on erasure coding, according to one or more embodiments. For example, assume that data corresponding to third and fourth rows in the encoded data is missing data 411. In operation 410, a portion 413 corresponding to the third and fourth rows in the coding matrix corresponding to the missing data 411 may have also been lost. In operation 420, a determinant from which the missing data 411 and the portion 413 of the corresponding matrix are removed may be represented. In operation 430, when both sides of the determinant are multiplied by an inverse matrix 431 of the coding matrix from which the portion 413 has been removed, only the original data may remain on the left side of the operation 430.

In summary, a portion of the original data may be restored by excluding the lost data 411 from the encoded data and multiplying a right side of the encoded data by the inverse matrix 431 of the coding matrix.

Operations based on the encoding and decoding operations described above may be performed by the DPU 231 without necessarily requiring intervention by the host processor 210 illustrated in FIG. 2, thereby avoiding corresponding overhead of the host processor 210.

Referring to FIG. 2, the storage device 240 may store data encoded by the interface device 230. In addition, the storage device 240 may transmit data requested from another electronic device directly to the interface device 230. For example, the storage device 240 may be an SSD using a non-volatile memory express (NVMe) protocol.

The interface device 230 and the storage device 240 may transmit or receive data through P2P communication without necessarily requiring intervention by the host processor 210 and the memory 220. Thus, in an example, P2P communication between the storage device 240 and the interface device 230 is without substantial intervention or interaction by the host processor 210 (although there may be some incidental operations on the host processor 210, for example handling collateral interrupts, bus control, etc.). For example, P2P communication may be based on a compute express link input/output (CXL.io) protocol. The interface device 230 and the storage device 240 may be connected by a peripheral component interconnect express (PCIe) switch or the like.

Erasure coding of the DFS may be accelerated through direct communication between the storage device 240 and the interface device 230 (e.g., a smart NIC) in the storage node 200. Regardless of whether DFS communications pass directly between the storage device 240 and the interface device 230, the DFS communications need not pass through the host processor 210 for erasure coding thereby. Thus, in an example, the DFS communications do not pas through the host processor 210.

For example, when a data request is made from a client node, data received by the interface device 230 may not be copied to the memory 220, and the DPU 231 in the interface device 230 may perform data encoding on the data in the data request as received via the network 120, for example. The interface device 230 may directly transmit, for example by PCIe P2p communication, to the storage device 240, data that the interface device 230 has encoded independently from the host processor 210 and the memory 220.

Similarly, when a data read request is made from the client node via the network 120, for example, corresponding encoded data stored in the storage device 240 may be transmitted to the interface device 230 through PCIe P2P communication independently of the host processor 210 and the memory 220. The DPU 231 may determine whether any of the encoded data is missing or unavailable. When determined that none of the encoded data is missing, the interface device 230 may transmit the original data excluding the parity block via the network 120 to the client node. Otherwise, when some of the requested encoded data is determined to be missing or unavailable, the DPU 231 may restore the original data by performing a decoding operation as described above.

As such, data copies may be performed without using the host memory 220 but rather by the DPU 231 in the interface device 230 performing encoding operations and decoding operations based on erasure coding, thereby potentially reducing data read/write latency and reducing overhead of the host processor 210.

In an example implementation, the storage device 240 may support a CXL protocol and thereby participate in a memory pool, and a DFS may be implemented using the memory pool.

In another example, the storage device 240 may include a second processing unit. The second processing unit may perform any portion of the encoding operation described above instead of, or in addition to, the DPU 231. In addition, the second processing unit may perform any portion of the decoding operation described above instead of, or in addition to, the DPU 231. In other words, the encoding operation and the decoding operation may be distributed amongst the DPU 231 and the second processing unit and may therefore be performed more efficiently.

Figure 5:
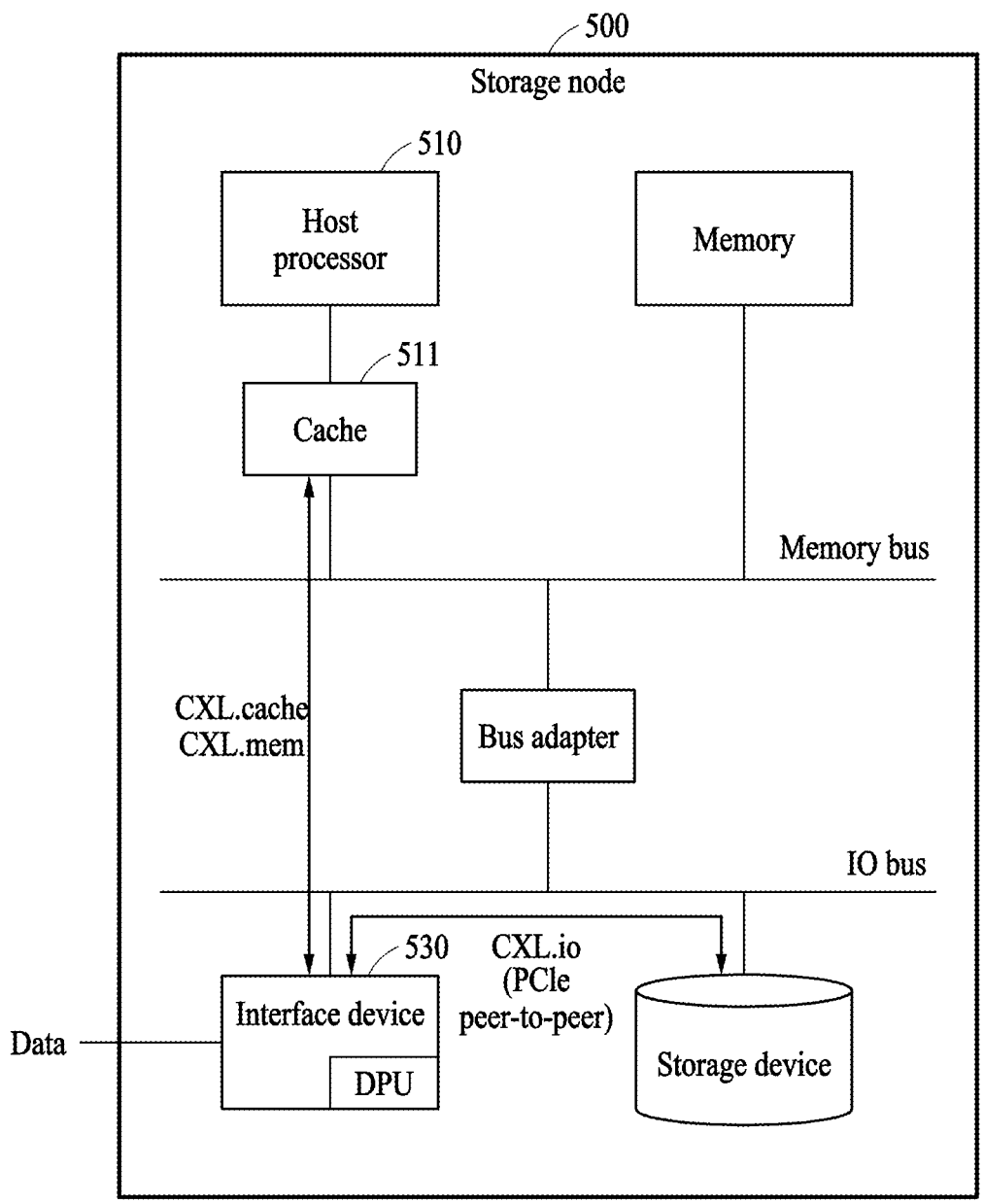
FIG. 5 illustrates an example of a storage node, according to one or more embodiments.

FIG. 5 illustrates an example of a storage node, according to one or more embodiments. Referring to FIG. 5, a storage node 500 may be an electronic device that also serves as a metadata server. In some examples the metadata server is not implemented on a storage node. When data is received by an interface device 530 from the network 120, metadata for the corresponding data may be transmitted to a cache 511 of the storage node 500. For example, metadata transmission and lookup may be based on a "CXL.cache" protocol, and a metadata update may be based on a "CXL.mem" protocol. A host processor 510 may process the aforementioned metadata (e.g., to determine the location and size of requested data). The descriptions provided with reference to FIG. 2 may also apply to FIG. 5. Thus, a more detailed description thereof is omitted here for brevity.

Figure 6:
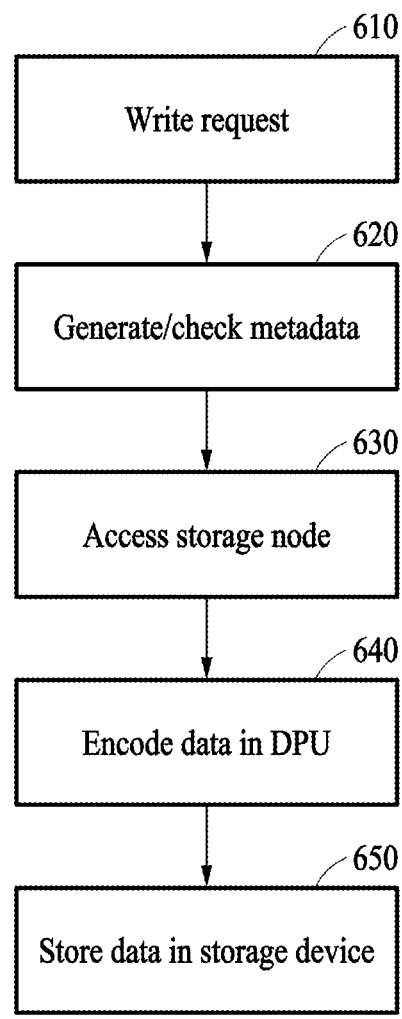
FIG. 6 illustrates an example of a write operation, according to one or more embodiments.

FIG. 6 illustrates an example of a write operation, according to one or more embodiments. In operation 610, a client node may request to write data, for example an update of an object stored in a DFS or an addition of an object to the DFS. In operation 620, when the write request is for writing new data (e.g., adding an object to the DFS), the client node may access a metadata server (e.g., a dedicated device or a storage node that also serves as a metadata server) via the network 120 to request metadata generation for the new data to be written. The metadata server may respond by generating new metadata for the data requested to be written and may return the generated metadata to the client node. When the write request involves modifying (updating) prestored data (e.g., updating an object to the DFS), metadata associated with the prestored data may be checked to identify a size and location of the prestored data (e.g., identification information of a storage node storing the data requested to be written, etc.). In operation 630, the client node may access the storage node identified based on the metadata and transmit the data to be written to the identified storage node via the network 120 to the storage node's interface device.

In operation 640, a processing unit of the storage node's interface device may receive the data to be written and may perform encoding on the received data (which may include generating parity data). In operation 650, the encoded data may be transmitted from the interface device directly to the storage node's storage device, which stores the encoded data.

Figure 7:
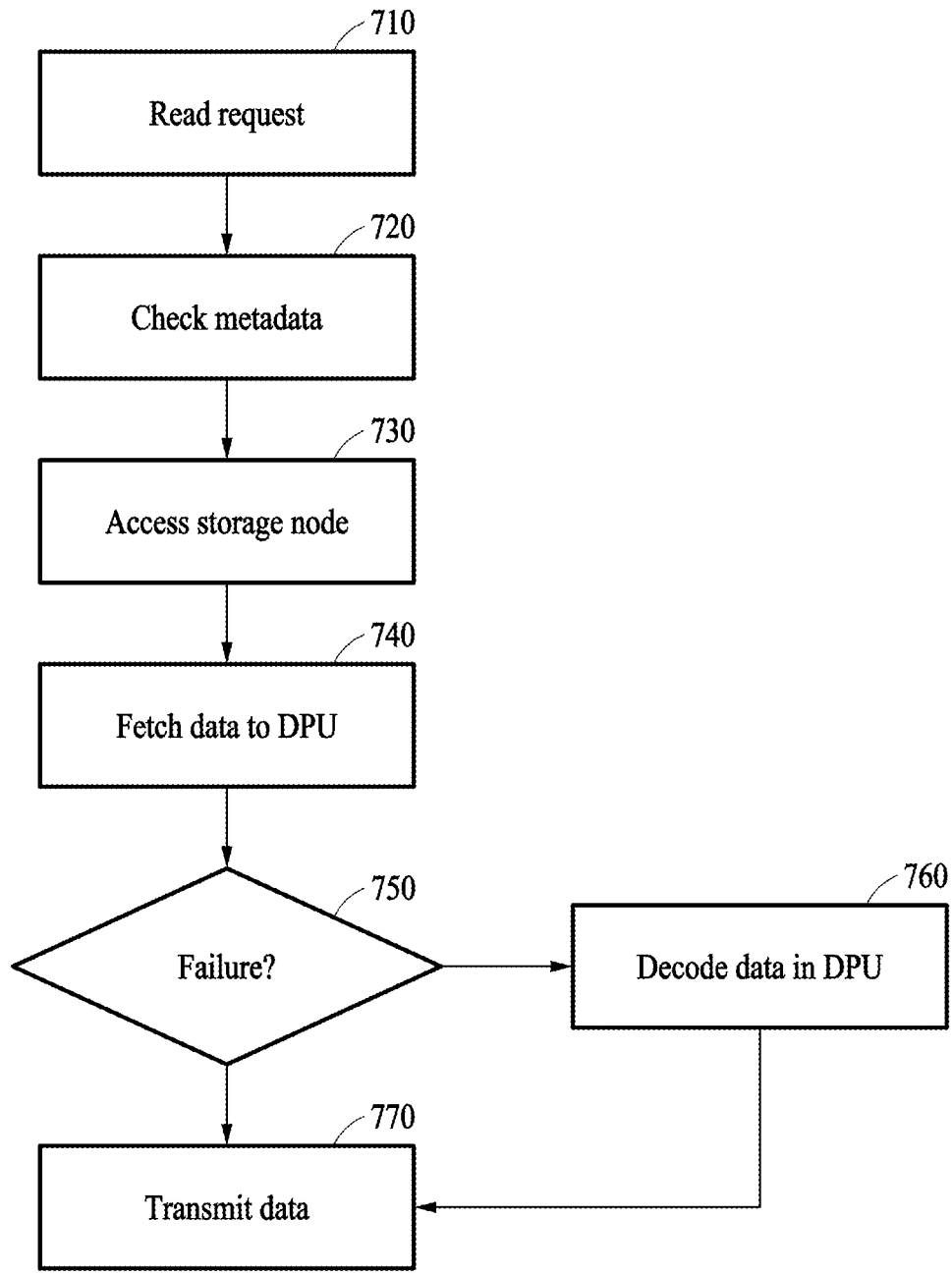
FIG. 7 illustrates an example of a read operation, according to one or more embodiments.

FIG. 7 illustrates an example of a read operation, according to one or more embodiments. In operation 710, a client node may request to read data, for example an object stored in a DFS. In operation 720, the client node may request a metadata check for the data to be read, and may do so by accessing a metadata server (e.g., a storage node that also serves as the metadata server) via the network 120. In response, the metadata server may verify a size and location of the data to be read (e.g., identification information of a storage node storing data, etc.) by performing the requested metadata check. In operation 730, the client node may access the identified storage node and may request the data that is to be read. In operation 740, an interface unit of the storage node may receive the request for the data from the network 120 and may respond by fetching the data from the storage node's storage device to a processing unit (e.g., a DPU) of the interface unit. In operation 750, the DPU of the interface unit may perform a parity check on the fetched data to determine whether any of the requested data is lost or missing. In operation 760, when some of the requested data is determined to be missing, the processing unit may recover the missing data by performing decoding for the missing data. In operation 770, the interface device may transmit any recovered and/or fetched data to the client node.

Figure 8:
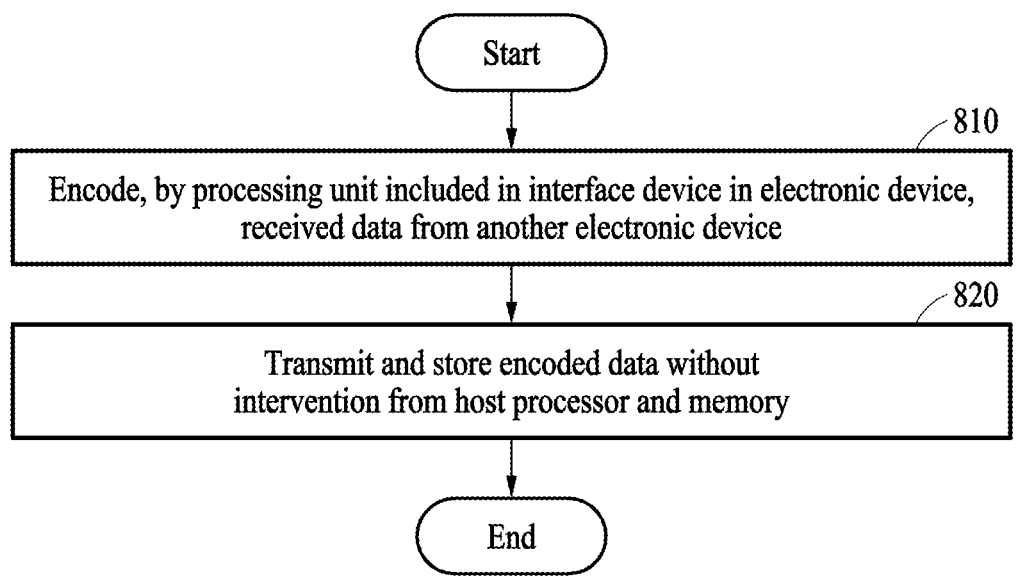
FIG. 8 illustrates an example of a method of operating an electronic device, according to one or more embodiments.

FIG. 8 illustrates an example of a method of operating an electronic device, according to one or more embodiments. In the following examples, operations may be performed in orders other than as shown. For example, at least two of the operations may be performed in parallel. Operations 810 and 820 may be performed by at least one hardware component (e.g., a processor, etc.) of the electronic device. The electronic device may correspond to a storage node.

In operation 810, the electronic device may encode, by a processing unit included in the interface device in the electronic device, data received from another electronic device. The electronic device may perform, by the processing unit, an operation of encoding original data received from another electronic device based on a coding matrix of erasure coding, and the encoded data may include the original data and a parity block for data recovery. The processing unit included in the interface device may include a DPU.

In operation 820, the electronic device may transmit and store the data encoded by the interface device to the storage device included in the electronic device without necessarily requiring intervention by a host processor and host memory of the electronic device. The storage device may directly receive or transmit data through P2P communication with the interface device. The interface device and the storage device may be connected by a PCIe switch and may exchange the data via the PCIe switch.

The electronic device may transfer data requested by another electronic device from its storage device to its interface device, and may perform an operation of decoding the data with the interface device's processing unit based on determining that some of the requested data is missing. The decoded data may be transmitted by the interface device to the other electronic device, for example via a network. When none of the requested data by the other electronic device is missing, the electronic device may transmit, by its interface device, the requested data (excluding a parity block of the data).

The electronic device may be one of a plurality of storage nodes included in a DFS, and data received from another electronic device may be a portion of DFS data, for example, stored in one or more of the plurality of storage nodes.

The storage device may include a second processing unit. The second processing unit may perform at least a portion of an encoding operation on data received from another electronic device. Similarly, for data to be retrieved for another electronic device, at least a portion of a decoding operation to be performed in response to determining that some of the requested data is missing may be performed by the second processing unit.

Data copying between the interface device and host memory, and between the host memory and the storage device, occurs many times when the host processor and the host memory perform encoding and decoding operations (e.g., based on the erasure coding). Techniques described herein may reduce or prevent such host-based processing for encoding and decoding and may thereby reduce overhead of the host processor.

The client node, network, metadata server, storage nodes, host processor, cache, memory, memory bus, bus adapter, interface device, data processing unit (DPU), storage device, computing devices, processing devices, as non-limiting examples, and other apparatuses, devices, modules, elements, and components described herein with respect to FIGS. 1-8 are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic unit or array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-8 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions used herein, which disclose algorithms for performing the operations that are performed by the hardware components and the methods as described above. In addition, as a non-limiting example, the instructions may be hard-coded into a processor such as a DPU (e.g., where the DPU may be implemented as an FPGA). In some implementations, a DPU may be configured to perform any one, any combination, or all operations and/or methods described herein, e.g., with pluggable modules, as a non-limiting example.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

What is claimed is:

1. A storage node for communicating via a network with other storage nodes, wherein the storage node and the storage nodes implement a distributed file system (DFS) thereon, the storage node comprising:
    a storage device; and
    a smart network interface card (NIC) comprising a processing unit;
    the smart NIC configured to:
        receive, from a client device, a write request comprising original data to be stored in the DFS, and responsive to receiving the write request:
            generate, by the processing unit, parity data by performing erasure coding on the original data; and
            store the parity data and the original data directly from the smart NIC to the storage device; and
        receive, from the client device or another client device, a read request for data of an object stored in the DFS, wherein the smart NIC is configured to, responsive to receiving the read request, to service the read request for the data:
            fetch a portion of the original data and the parity data directly from the storage device;
            perform a parity check on the fetched portion and the fetched parity data to determine that a portion of the data requested by the read request is missing; and based on determining that a portion of the data requested by the read request is missing, recover, by the processing unit, the missing portion of the original data by applying forward error correction (FEC) decoding to the fetched portion of the original data using the fetched parity data.

2. The storage node of claim 1, wherein the storage node is further configured to transmit, by the smart NIC, the fetched portion of the original data and the recovered other portion of the original data via a network to the client device or the other client device.

3. The storage node of claim 1, wherein the write request is received from a network connected to the storage node.

4. The storage node of claim 1, wherein the read request is received from a network connected to the storage node.

5. The storage node of claim 1, further comprising:
a memory;
a host processor, wherein the storage node is configured to cause the host processor to execute an operating system; and
a bus interconnecting the host processor, the memory, the smart NIC, and the storage device,
wherein the directly storing of the parity data and the original data comprises sending the parity data and the original data directly from the NIC to the storage device via the bus.

6. The storage node of claim 1, wherein the smart NIC and the storage device are connected by a peripheral component interconnect express (PCIe) switch, and wherein the original data and the parity data are fetched directly from the storage device to the smart NIC via the PCIe switch.

7. The storage node of claim 1, wherein the performing the erasure coding is based on a coding matrix of erasure coding.

8. The storage node of claim 1, wherein the smart NIC is configured to determine that a loss of at least some of the original data has occurred and perform the FEC decoding based thereon.

9. The storage node of claim 8, wherein the smart NIC is configured to determine that there has been a loss of at least some of the original data and to fetch the parity data based thereon.

10. The storage node of claim 1, wherein the storage device comprises a second processing unit configured to perform FEC encoding or decoding on data of the DFS stored in, or to be stored in, the storage device.

11. The storage node of claim 1, wherein the storage device comprises a memory pool for supporting a compute express link (CXL).

12. A method of operating a storage node comprising a smart network interface card (NIC) and a storage device, the method comprising:
receiving, by the smart NIC, distributed filesystem (DFS) data from a client device of an object stored in, or being stored in, the DFS, the smart NIC comprising a processing unit, the DFS data comprising data to be stored in a DFS;
in response to receiving the DFS data, generating parity data by the processing unit performing erasure encoding on the received DFS data;
copying the DFS data and the parity data directly from the smart NIC to the storage device, wherein the DFS data is stored in the storage device as data of an object stored in the DFS; receiving, by the smart NIC, a read request associated with the DFS data;
in response to receiving the read request for the object, which is stored in the DFS, copying a first portion of the DFS data directly from the storage device to the smart NIC;
determining, by the processing unit, that a second portion of the DFS data is missing, and based thereon using, by the processing unit, the parity data to recover the second portion of the DFS data; and
transmitting, by the smart NIC, the first and second portions of the DFS data.

13. The method of claim 12, wherein the storage node further comprises a processor and memory configured to cooperate to execute an operating system, and wherein the memory and processor are not used for the generating the parity data or for the recovering the second portion of the DFS data.

14. The method of claim 12, further comprising:
receiving a write request from a first client device via a network, the write request comprising the DFS data.

15. The method of claim 14, further comprising:
receiving the read request from the client device or a second client device via the network; and
transmitting the first and second portions of the DFS data via the network to the client device or the second electronic device.

16. The method of claim 12, wherein the storage node is one storage node among a plurality of storage nodes that cooperate via a network to provide the DFS, and
wherein the received DFS data comprises a portion of data stored in one or more other storage nodes among the plurality of storage nodes.

17. A non-transitory computer-readable storage medium storing instructions that, when executed by a processor, configure the processor to perform the method of claim 12.

18. A method performed by a storage node comprising a smart network interface card (NIC) and a storage device, the method comprising:
receiving, by the smart NIC, distributed filesystem (DFS), from clients, read requests and DFS write requests for objects stored in DFS stored on and implemented by storage nodes including the storage node;
generating, by the smart NIC, DFS parity data for original DFS data in the DFS write requests;
adding the original DFS data and the DFS parity data to the DFS by storing the original DFS data and the DFS parity data in the storage device; and
based on the DFS read requests, reading, by the smart NIC, at least some of the original DFS data and the DFS parity data, and based thereon, reconstructing, by the smart NIC, at least some portions of the original DFS data.

19. The method of claim 18, wherein the generating the parity comprises performing forward error correction coding on the original DFS data.

20. The method of claim 19, wherein the forward error correction coding comprises erasure coding.

* * * * *